(12) United States Patent
Komoriyama et al.

(10) Patent No.: US 11,881,846 B2
(45) Date of Patent: Jan. 23, 2024

(54) LOAD DRIVE DEVICE AND TRANSMISSION DRIVE SYSTEM

(71) Applicant: Hitachi Astemo, Ltd., Hitachinaka (JP)

(72) Inventors: Keishi Komoriyama, Hitachinaka (JP); Yoichiro Kobayashi, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 394 days.

(21) Appl. No.: 17/289,320

(22) PCT Filed: Sep. 26, 2019

(86) PCT No.: PCT/JP2019/037755
§ 371 (c)(1),
(2) Date: Apr. 28, 2021

(87) PCT Pub. No.: WO2020/095561
PCT Pub. Date: May 14, 2020

(65) Prior Publication Data
US 2022/0014183 A1 Jan. 13, 2022

(30) Foreign Application Priority Data
Nov. 6, 2018 (JP) .................................. 2018-208624

(51) Int. Cl.
*H03K 17/08* (2006.01)
*H03K 17/082* (2006.01)
(Continued)

(52) U.S. Cl.
CPC ......... *H03K 17/0822* (2013.01); *G01R 1/206* (2013.01); *G01R 19/0092* (2013.01); *H03K 2217/0027* (2013.01)

(58) Field of Classification Search
CPC ... H01C 7/13; H02H 3/08; H02H 9/02; H03K 17/0822; H03K 17/082; H03K 17/08;
(Continued)

(56) References Cited

U.S. PATENT DOCUMENTS

| 5,815,027 A | 9/1998 | Tihanyi et al. |
| 6,377,034 B1 * | 4/2002 | Ivanov ................ G05F 3/245 |
| | | 323/224 |

(Continued)

FOREIGN PATENT DOCUMENTS

| JP | 6-180332 A | 6/1994 |
| JP | 8-334534 A | 12/1996 |

(Continued)

OTHER PUBLICATIONS

International Search Report (PCT/ISA/210) issued in PCT Application No. PCT/JP2019/037755 dated Dec. 24, 2019 with English translation (five (5) pages).
(Continued)

*Primary Examiner* — Jeffrey A Gblende
(74) *Attorney, Agent, or Firm* — Crowell & Moring LLP

(57) ABSTRACT

To prevent deterioration of current detection accuracy due to a difference in deterioration between a main MOS and a sense MOS. The load drive device includes a main MOS (101) for supplying a load current to a load, a sense MOS (102) to be used for detection of the load current, and an equalizer circuit (110) and a switch (120) which are provided in parallel between the source terminal of the main MOS and the source terminal of the sense MOS. The drain terminal of the main MOS and the drain terminal of the sense MOS have a common connection, and when a current is detected, the terminal voltage of the main MOS and the terminal voltage of the sense MOS are equalized by the equalizer circuit, and the switch is opened. When a current is not detected, the equalizer circuit is stopped and the switch short-circuits the source terminal of the main MOS and the source terminal of the sense MOS.

9 Claims, 7 Drawing Sheets

(51) Int. Cl.
*G01R 1/20* (2006.01)
*G01R 19/00* (2006.01)
(58) Field of Classification Search
CPC .. H03K 2217/0027; G01R 1/206; G01R 1/20;
G01R 19/0092
See application file for complete search history.

(56) References Cited

U.S. PATENT DOCUMENTS

| | | | |
|---|---|---|---|
| 8,373,449 B2 | 2/2013 | Thiele et al. | |
| 9,152,163 B1 | 10/2015 | Fabbro et al. | |
| 2005/0046438 A1* | 3/2005 | Tam | G11C 7/062 324/76.11 |
| 2006/0197580 A1* | 9/2006 | Barker | H03K 17/0822 327/365 |
| 2017/0328934 A1 | 11/2017 | Mayell | |

FOREIGN PATENT DOCUMENTS

| | | |
|---|---|---|
| JP | 2007-174788 A | 7/2007 |
| JP | 2014-49975 A | 3/2014 |
| JP | 2017-208814 A | 11/2017 |

OTHER PUBLICATIONS

Japanese-language Written Opinion (PCT/ISA/237) issued in PCT Application No. PCT/JP2019/037755 dated Dec. 24, 2019 (three (3) pages).

* cited by examiner

LOAD DRIVE DEVICE AND TRANSMISSION DRIVE SYSTEM

TECHNICAL FIELD

The present invention relates to a load drive device and a transmission drive system.

BACKGROUND ART

As a current detection circuit for a load drive device, etc., it is known that a sense MOS method is employed in which a detection current is output in proportion to a load current (drive current) according to an on-resistance ratio of the main MOSFET for a driver (hereinafter, main MOS) and a sense MOSFET for current detection (hereinafter, sense MOS) (for example, see PTL 1). The current detection circuit described in PTL 1 is provided with an equalizer circuit that equalizes the terminal voltages of the main MOS and the sense MOS. When the load current is output by the main MOS, the equalizer circuit matches the terminal voltages of the main MOS and the sense MOS to improve the current detection accuracy.

CITATION LIST

Patent Literature

PTL 1: JP 2017-208814 A

SUMMARY OF INVENTION

Technical Problem

In the above-mentioned sense MOS method, it is important that the on-resistance ratio between the main MOS that outputs the load current and the sense MOS is kept constant. The on-resistance referred to here is a resistance in a deep linear region in which the drain-source current of the MOSFET and the drain-source voltage are proportional to each other. In the linear region, MOSFETs can be roughly regarded as linear resistors. Since this on-resistance varies depending on physical properties such as a threshold voltage Vth and channel mobility in addition to the temperature conditions of the MOSFET, it is desirable that the temperature conditions and physical properties of the main MOS and the sense MOS match.

Of the above parameters, the temperature condition is determined by the ambient temperature and the operation mode, and can be solved by arranging the main MOS and the sense MOS to be physically adjacent. On the other hand, with regard to physical properties, for example, a deterioration model known as hot carrier injection can cause permanent fluctuations in characteristic values. In particular, if the degree of deterioration due to hot carrier injection differs between the main MOS and the sense MOS and the fluctuations in the characteristic values are not uniform, the on-resistance ratio changes and the proportional relationship between the load current and the detection current breaks down, and thus a current detection accuracy deteriorates.

In the current detection circuit described in PTL 1, the degree of deterioration due to hot carrier injection or the like can be made uniform by equalizing the terminal voltages of the main MOS and the sense MOS by an equalizer circuit using an operational amplifier. Since the voltage difference between the main MOS and the sense MOS is small when a current is detected, the terminal voltages of the main MOS and the sense MOS can be equalized by the operational amplifier. However, when a current is not detected, the voltage difference between the main MOS and the sense MOS becomes large, and it is difficult to equalize the terminal voltages of the main MOS and the sense MOS with an operational amplifier having a narrow operating voltage range.

As described above, the stress conditions due to the voltage difference between the main MOS and the sense MOS are different, and the degree of deterioration of the main MOS and the sense MOS is different, so that the current detection accuracy deteriorates. In this case, it is conceivable to use an operational amplifier having a wide operating voltage range, but there is a problem that the circuit configuration becomes complicated.

The invention has been made in view of the above circumstances, and an object of the invention is to provide a load drive device and a transmission drive system that can prevent deterioration in the current detection accuracy due to a difference in the degree of deterioration between the main MOS and the sense MOS.

Solution to Problem

The load drive device of one aspect of the invention is a load drive device for driving a load according to a load current and detecting the load current. The load drive device includes a main MOSFET that outputs the load current, a sense MOSFET that is used to detect the load current, an equalizer circuit that is provided between one main terminal of the main MOSFET and one main terminal of the sense MOSFET, and a switch that is provided in parallel with the equalizer circuit between one main terminal of the main MOSFET and one main terminal of the sense MOSFET. Another main terminal of the main MOSFET and another main terminal of the sense MOSFET have a common connection. The equalizer circuit equalizes a terminal voltage of the main MOSFET and a terminal voltage of the sense MOSFET when a current is detected, and the switch is opened. The equalizer circuit is stopped when a current is not detected, and one main terminal of the main MOSFET and one main terminal of the sense MOSFET are short-circuited by the switch.

Advantageous Effects of Invention

According to the invention, deterioration in a current detection accuracy can be prevented by matching the degree of deterioration between the main MOSFET and the sense MOSFET using an equalizer circuit that operates in equalization when a current is detected and a switch that is short-circuited when a current is not detected. Other features of the invention will be clear from the description and the accompanying drawings. In addition, objects, configurations, and effects besides the above description will be apparent through the explanation on the following embodiments.

DESCRIPTION OF EMBODIMENTS

Embodiments of the invention will be described with reference to the accompanying drawings. Further, the embodiments described below do not limit the scope of the invention. Not all the elements and combinations thereof described in the embodiments are essential to the solution of the invention.

First Embodiment

Figure 1:
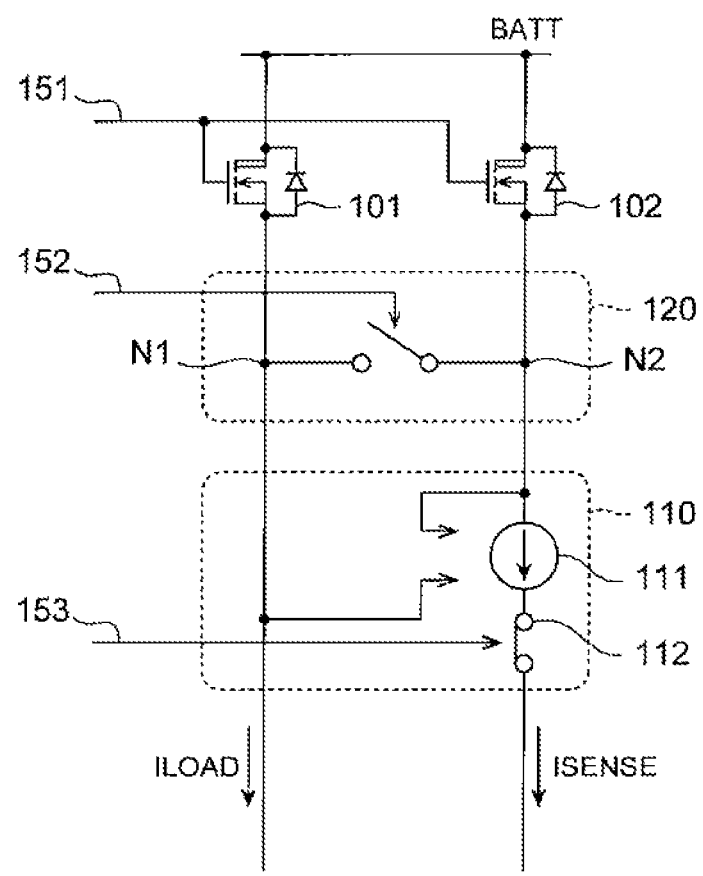
FIG. 1 is a schematic view of a load drive device according to a first embodiment.

FIG. 1 is a schematic view of a load drive device according to the first embodiment. As illustrated in FIG. 1, the load drive device is formed with a load drive circuit that drives a load 280 (see FIG. 3) and a current detection circuit that detects a load current ILOAD output to the load 280. The load drive circuit is provided with a main MOS 101 that operates as a switch on the current path of the load current ILOAD from a voltage source BATT to the load 280 (hereinafter, referred to as a load current path). In addition, the current detection circuit is provided with a sense MOS 102 that operates as a switch on the current path of a detection current ISENSE (hereinafter, referred to as a detection current path) from the voltage source BATT to an ADC (Analog to Digital Converter) 270 (see FIG. 3).

A control signal 151 is input to the gate terminal of the main MOS 101, and the main MOS 101 is switched ON or OFF by controlling the gate voltage. The drain terminal (the other main terminal) of the main MOS 101 is connected to the voltage source BATT, and the source terminal (one main terminal) of the main MOS 101 is connected to a node N1 on the load current path. The load current ILOAD is supplied to the load 280 via the node N1 by the main MOS 101.

In this way, the main MOS 101 outputs the load current ILOAD. The load 280 is not limited to an inductive load but may be a resistance load.

The gate terminal of the sense MOS 102 has a common connection with the gate terminal of the main MOS 101, the control signal 151 is input, and the sense MOS 102 is switched ON or OFF by controlling the gate voltage. The drain terminal of the sense MOS 102 (the other main terminal) is connected to the voltage source BATT with a common connection with the drain terminal of the main MOS 101, and the source terminal (one main terminal) of the sense MOS 102 is connected to a node N2 on the detection current path. The sense MOS 102 supplies the ADC 270 with the detection current ISENSE proportional to the load current ILOAD via the node N2. Thus, the sense MOS 102 is used to detect the load current ILOAD.

The characteristics of the sense MOS 102 are consistent with those of the main MOS 101, and the on-resistance of the sense MOS 102 is set to K times the on-resistance of the main MOS 101, that is, the on-resistance ratio of the main MOS 101 to the sense MOS 102 is set to 1:K. Therefore, the load current output from the main MOS 101 multiplied by 1/K is output as the detection current from the sense MOS 102.

Further, the load drive device is provided with an equalizer circuit 110 between the source terminal of the main MOS 101 and the source terminal of the sense MOS 102. The equalizer circuit 110 performs control to align (make the same potential) the voltage of the node N2 on the detection current path (the terminal voltage of the sense MOS 102) with the voltage of the node N1 on the load current path (the terminal voltage of main MOS 101). A control signal 153 synchronized with the control signal 151 is input to the equalizer circuit 110, the equalizer circuit 110 is controlled to be the operating state when the main MOS 101 is turned ON, and the equalizer circuit 110 is controlled to be the stopped state when the main MOS 101 is turned OFF.

The equalizer circuit 110 is, for example, an operational amplifier in which a voltage-controlled current source 111 and a switch 112 are provided on a detection current path. In this case, one end of the input of the voltage-controlled current source 111 is connected to the node N2, and the other end of the input of the voltage-controlled current source 111 is connected to the node N1, and the output current amount is controlled so as to eliminate the voltage difference between the two inputs. The switch 112 is switched between short-circuit and open by the control signal 153. The amount of current in the detection current path is adjusted so that the equalizer circuit 110 equalizes the voltages of the nodes N1 and N2 when the switch 112 is short-circuited, and the detection current path is cut off when the switch 112 is opened, so the operation of the equalizer circuit 110 is stopped.

In such an equalizer circuit 110, since the nodes N1 and N2 both have high voltage levels when current is detected (when the main MOS 101 is turned ON), the voltages of the nodes N1 and N2 can be equalized by the equalizer circuit 110 such as an operational amplifier. On the other hand, when current is not detected (when the main MOS 101 is OFF), the current may be drawn into the load 280 (see FIG. 3) such as an inductive load connected to the node N1, and the voltage on the node N1 side may drop. Further, the node N2 side is necessary to secure a voltage equal to or higher than a predetermined value in order to drive the equalizer circuit 110. Therefore, the voltage difference between the nodes N1 and N2 becomes large, so it is difficult to equalize the voltages of the nodes N1 and N2 only by the equalizer circuit 110.

Therefore, in the load drive device of this embodiment, a switch 120 is provided in parallel with the equalizer circuit 110 between the source terminal of the main MOS 101 and the source terminal of the sense MOS 102. A control signal 152 synchronized with the inversion signal of the control signal 151 is input to the switch 120, and the switch 120 is controlled to be the open state when the main MOS 101 is turned ON, and the switch 120 is controlled to be the conductive state when the main MOS 101 is turned OFF. Even if the voltage difference between the nodes N1 and N2 is large, the voltages of the nodes N1 and N2 are aligned by short-circuiting the nodes N1 and N2 by the switch 120.

Figure 2:
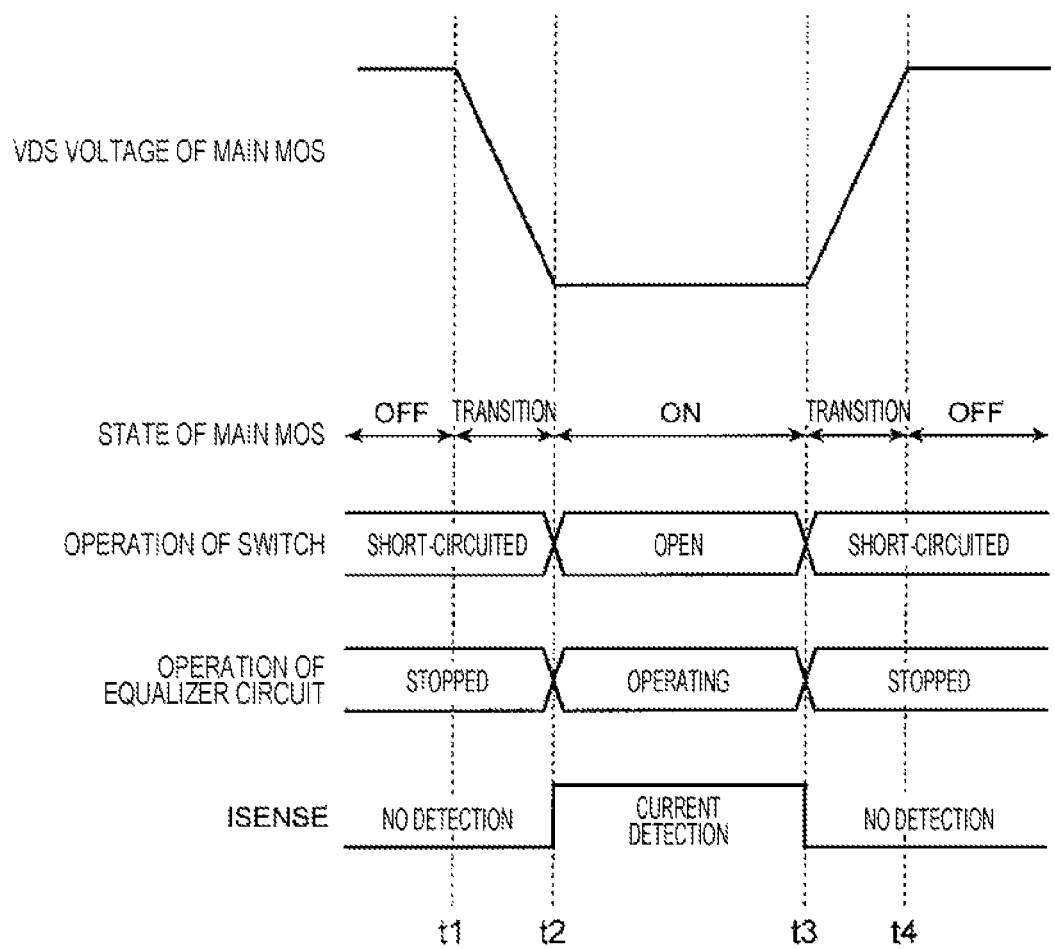
FIG. 2 is a timing chart of the load drive device illustrated in FIG. 1.

FIG. 2 is a timing chart of the load drive device illustrated in FIG. 1. FIG. 2 illustrates the state changes of a drain-source voltage VDS of the main MOS 101, the main MOS 101, the switch 120, the equalizer circuit 110, and the detection current ISENSE over time. Here, the OFF state of the MOS is a state in which the gate-source voltage is less than a threshold voltage and no channel is formed. The ON state of the MOS is a state in which the gate-source voltage is sufficiently larger than the threshold voltage and the drain-source voltage is sufficiently low to enter a deep linear region. The transition section between the ON state and the OFF state of the MOS is a transition period during which the ON state and the OFF state are switched.

As illustrated in FIG. 2, the nodes N1 and N2 are short-circuited by the switch 120 in the OFF section (when no current is detected) of the main MOS 101 before and after the time t1 and t4. On the other hand, the equalizer circuit 110 is stopped, and the detection current ISENSE is not detected because the detection current path is cut off by the equalizer circuit 110. At this time, since the nodes N1 and N2 are short-circuited regardless of the magnitude of the voltage of the node N1, the voltages of the nodes N1 and N2 are aligned. In this way, in the OFF section of the main MOS 101, the voltage conditions match for all the terminals of the main MOS 101 and the sense MOS 102.

Similarly, in the transition section from time t1 to time t2 and the transition section from time t3 to time t4 (when no current is detected), the nodes N1 and N2 are short-circuited by the switch 120. On the other hand, the equalizer circuit 110 is stopped, and the detection current ISENSE is not detected because the detection current path is cut off by the equalizer circuit 110. At this time, since the nodes N1 and N2 are short-circuited regardless of the magnitude of the voltage of the node N1, the voltages of the nodes N1 and N2 are aligned. In this way, in the transition section of the main MOS 101, the voltage conditions match for all the terminals of the main MOS 101 and the sense MOS 102.

In the ON section (when current is detected) of the main MOS 101 from time t2 to time t3, the switches 120 of the nodes N1 and N2 are open. On the other hand, the equalizer circuit 110 is operating, and the detection current ISENSE is adjusted by the equalizer circuit 110 so that the voltages of the nodes N1 and N2 are equalized. At this time, since the voltage difference between the nodes N1 and N2 is small, it is possible to use a small operational amplifier having a narrow operating voltage range with respect to the equalizer circuit 110. In this way, in the ON section of the main MOS 101, the voltage conditions match for all the terminals of the main MOS 101 and the sense MOS 102.

In this state, if the power source voltage is BATT, the on-resistance of the main MOS 101 is Ron, and the load current is ILOAD, the voltage of the node N1 is represented by BATT−Ron×ILOAD. If the power source voltage is BATT, the on-resistance of the sense MOS 102 is K×Ron, and the detection current is ISENSE, the voltage of the node N2 is represented by BATT−K×Ron×ISENSE. Since the voltages of the nodes N1 and N2 are equal in the ON section of the main MOS 101, the detection current ISENSE is detected by the following Expression (1).

$$ISENSE = ILOAD/K \qquad (1)$$

By the above operation, the voltage conditions match for all the terminals of the main MOS 101 and the sense MOS 102 over the entire sections from the OFF section to the ON section of the main MOS 101.

Therefore, it can be expected that the electrical stress conditions of both are equal and the amount of deterioration due to electrical stress is also equal. At this time, since the on-resistance ratio of the main MOS 101 and the sense MOS 102 is maintained, the accuracy of the detection current value can be maintained without deterioration over time.

Figure 3:
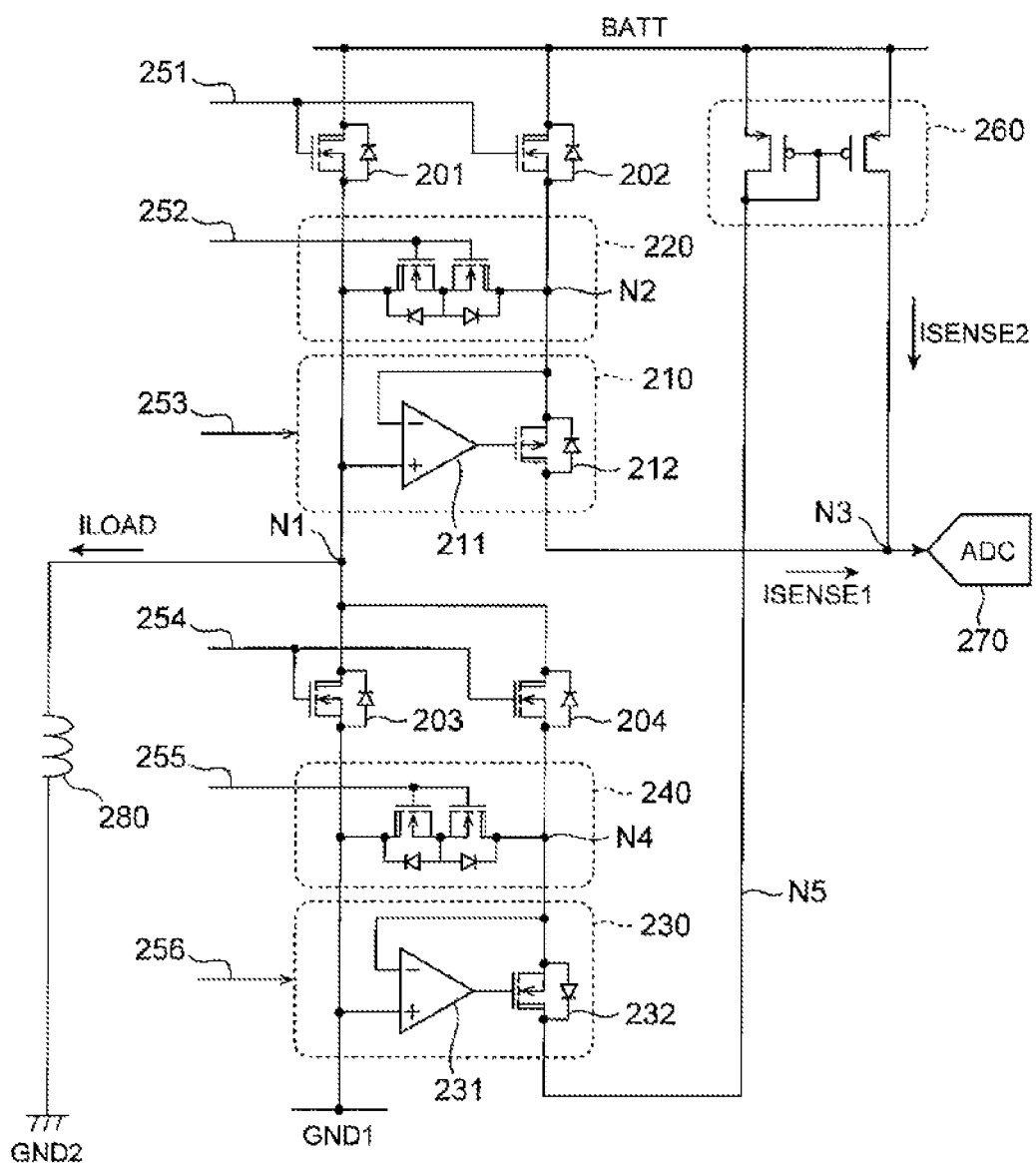
FIG. 3 is a circuit diagram of an L load drive circuit according to the first embodiment.

FIG. 3 is a circuit diagram of the L load drive circuit (load drive device) according to the first embodiment. Here, an example in which the circuit configuration illustrated in FIG. 1 is applied to a high-side driver of a synchronous rectification type L load drive circuit as a load drive device will be described. The L load drive circuit is provided with a current detection circuit that detects the load current ILOAD on the high side and the low side. Further, the L load drive circuit is provided with a PMOS current mirror circuit 260 for low-side (reflux-side) current detection. Further, the L load drive circuit is provided with the ADC 270 that converts the detection current into a digital signal for detection.

On the high side of the L load drive circuit, a main MOS 201 is provided on the load current path, and a sense MOS 202 is provided on the detection current path. The gate voltage of the main MOS 201 is controlled by a control signal 251 to operate as a high-side switch on the load current path. The drain terminal of the main MOS 201 is connected to the voltage source BATT, and the source terminal of the main MOS 201 is connected to the L load 280 via the node N1. When the main MOS 201 is turned on, the load current ILOAD is supplied from the voltage source BATT to the L load 280 to drive the L load 280.

The gate terminal of the sense MOS 202 has a common connection with the gate terminal of the main MOS 201, and the gate voltage is controlled by the control signal 251 to operate as a high-side switch on the detection current path. The drain terminal of the sense MOS 202 is connected to the voltage source BATT with a common connection with the drain terminal of the main MOS 201, and the source terminal of the sense MOS 202 is connected to the ADC 270 via the node N2. Further, the characteristics of the sense MOS 202 match the characteristics of the main MOS 201, and the on-resistance of the sense MOS 202 is set to K times the on-resistance of the main MOS 201.

An equalizer circuit 210 and a switch 220 are provided in parallel between the source terminals of the main MOS 201 and the sense MOS 202. A control signal 253 synchronized with the control signal 251 is input to the equalizer circuit 210, the equalizer circuit 210 is controlled to be the operating state when the main MOS 201 is turned ON, and the equalizer circuit 210 is controlled to be the stopped state when the main MOS 201 is turned OFF. The equalizer circuit 210 includes an operational amplifier 211 and a PMOS 212. The inverting input terminal of the operational amplifier 211 is connected to the node N2 on the detection current path, and the non-inverting input terminal of the operational amplifier 211 is connected to the node N1 on the load current path. The output terminal of the operational amplifier 211 is connected to the gate terminal of PMOS 212.

A voltage corresponding to the nodes N1 and N2 is applied to the gate terminal of the PMOS 212 to adjust the amount of current flowing through the node N2. The voltage change of the node N2 at this time is fed back to the inverting input terminal of the operational amplifier 211, so that the voltage difference between the nodes N1 and N2 is controlled to be small. In the operating state of the equalizer circuit 210, the operational amplifier 211 controls the amount of current passing through the PMOS 212 so that the inverting input terminal and the non-inverting input terminal are virtually short-circuited. Further, in the stopped state of the equalizer circuit 210, the PMOS 212 is controlled to be the OFF state so that the detection current path is cut by the operational amplifier 211.

A control signal 252 synchronized with the inversion signal of the control signal 251 is input to the switch 220, and the switch 220 is controlled to be the open state when the main MOS 201 is turned ON, and the switch 220 is controlled to be the conductive state when the main MOS 201 is turned OFF. Even if the voltage difference between the nodes N1 and N2 is large, the voltages of the nodes N1 and N2 are aligned by short-circuiting the nodes N1 and N2 by the switch 220. Although the switch 220 of this embodiment is formed by a MOSFET, it may be formed by another switching element such as a bipolar transistor.

On the low side of the L load drive circuit, a reflux main MOS 203 is provided on the load current path, and a reflux sense MOS 204 is provided on the detection current path. The reflux main MOS 203 operates as a low-side switch on the load current path by controlling the gate voltage by a control signal 254. The drain terminal of the reflux main MOS 203 is connected to the L load (inductive load) 280 via the node N1, and the source terminal of the reflux main MOS 203 is earthed to a node (ground) GND1. The reflux main MOS 203 forms a reflux path for releasing the energy stored in the L load 280.

The gate terminal of the reflux sense MOS 204 has a common connection with the gate terminal of the reflux main MOS 203, and the gate voltage is controlled by the control signal 254 to operate as a low-side switch on the detection current path. The drain terminal of the reflux sense MOS 204 is connected to the L load 280 with a common connection with the drain terminal of the reflux main MOS 203, and the source terminal of the reflux sense MOS 204 is connected to the current input side of the current mirror circuit 260 via a node N5. Further, the characteristics of the reflux sense MOS 204 are consistent with those of the reflux main MOS 203, and the on-resistance of the reflux sense MOS 204 is set to K times the on-resistance of the reflux main MOS 203.

An equalizer circuit 230 and a switch 240 are provided in parallel between the source terminals of the reflux main MOS 203 and the reflux sense MOS 204. A control signal 256 synchronized with the control signal 254 is input to the equalizer circuit 230, the equalizer circuit 230 is controlled to be the operating state when the reflux main MOS 203 is turned ON, and the equalizer circuit 230 is controlled to be the stopped state when the reflux main MOS 203 is turned OFF. The equalizer circuit 230 includes an operational amplifier 231 and an NMOS 232. The inverting input terminal of the operational amplifier 231 is connected to the node N4 on the detection current path, and the non-inverting input terminal of the operational amplifier 231 is connected to the node GND1. The output terminal of the operational amplifier 231 is connected to the gate terminal of the NMOS 232.

The voltage difference between the nodes GND1 and N4 is applied to the gate terminal of the NMOS 232, and the amount of current flowing through the node N4 is adjusted according to the voltage difference. The voltage change of the node N4 at this time is fed back to the inverting input terminal of the operational amplifier 231, so that the voltage difference between the nodes GND1 and N4 is controlled to be small. In the operating state of the equalizer circuit 230, the operational amplifier 231 controls the amount of current passing through the NMOS 232 so that the inverting input terminal and the non-inverting input terminal are virtually short-circuited. Further, in the stopped state of the equalizer circuit 230, the NMOS 232 is controlled to be the OFF state so that the detection current path is cut by the operational amplifier 231.

A control signal 255 synchronized with the inversion signal of the control signal 254 is input to the switch 240, and the switch 240 is controlled to be the open state when the reflux main MOS 203 is turned ON, and the switch 240 is controlled to be the conductive state when the reflux main MOS 203 is turned OFF. Even if the voltage difference between the nodes N1 and N4 is large, the voltages of the nodes N1 and N4 are aligned by short-circuiting the nodes N1 and N4 by the switch 240. Although the switch 240 of this embodiment is formed by a MOSFET, it may be formed by another switching element such as a bipolar transistor.

The current mirror circuit 260 is formed by a PMOS on the current input side and a PMOS on the current output side. The current input side of the current mirror circuit 260 is provided between the voltage source BATT and the NMOS 232 of the low-side equalizer circuit 230, and the current output side of the current mirror circuit 260 is provided between the voltage source BATT and the ADC 270. The current mirror circuit 260 copies the current in the low-side detection current path when the reflux sense MOS 204 is turned ON, and outputs the current as the detection current toward the ADC 270 on the current output side.

In the L load drive circuit configured in this way, the high-side main MOS 201 and the low-side reflux main MOS 203 can be switched ON and OFF alternately. When the high-side main MOS 201 is turned ON, the high-side sense MOS 202 is turned ON, and the low-side reflux main MOS 203 and reflux sense MOS 204 are turned OFF. As a result, the load current ILOAD flows from the voltage source BATT to the L load 280 through the main MOS 201 on the high side. In addition, a detection current ISENSE1 flows from the voltage source BATT to the ADC 270 through the sense MOS 202 on the high side.

When the low-side reflux main MOS 203 is turned ON, the low-side reflux sense MOS 204 is turned ON, and the high-side main MOS 201 and sense MOS 202 are turned OFF. Even if the high-side main MOS 201 is turned OFF, the load current ILOAD is drawn by the L load 280, so the load current ILOAD flows from the node GND1 side toward the L load 280 through the reflux main MOS 203 on the low side. Further, when the current flows from the voltage source BATT toward the reflux sense MOS 204 on the current input side of the current mirror circuit 260, a detection current ISENSE2 flows from the voltage source BATT toward the ADC 270 on the current output side of the current mirror circuit 260. Although the circuit configuration of FIG. 1 is applied to both the low side and the high side here, the circuit configuration of FIG. 1 may be applied to at least one of them.

Figure 4:
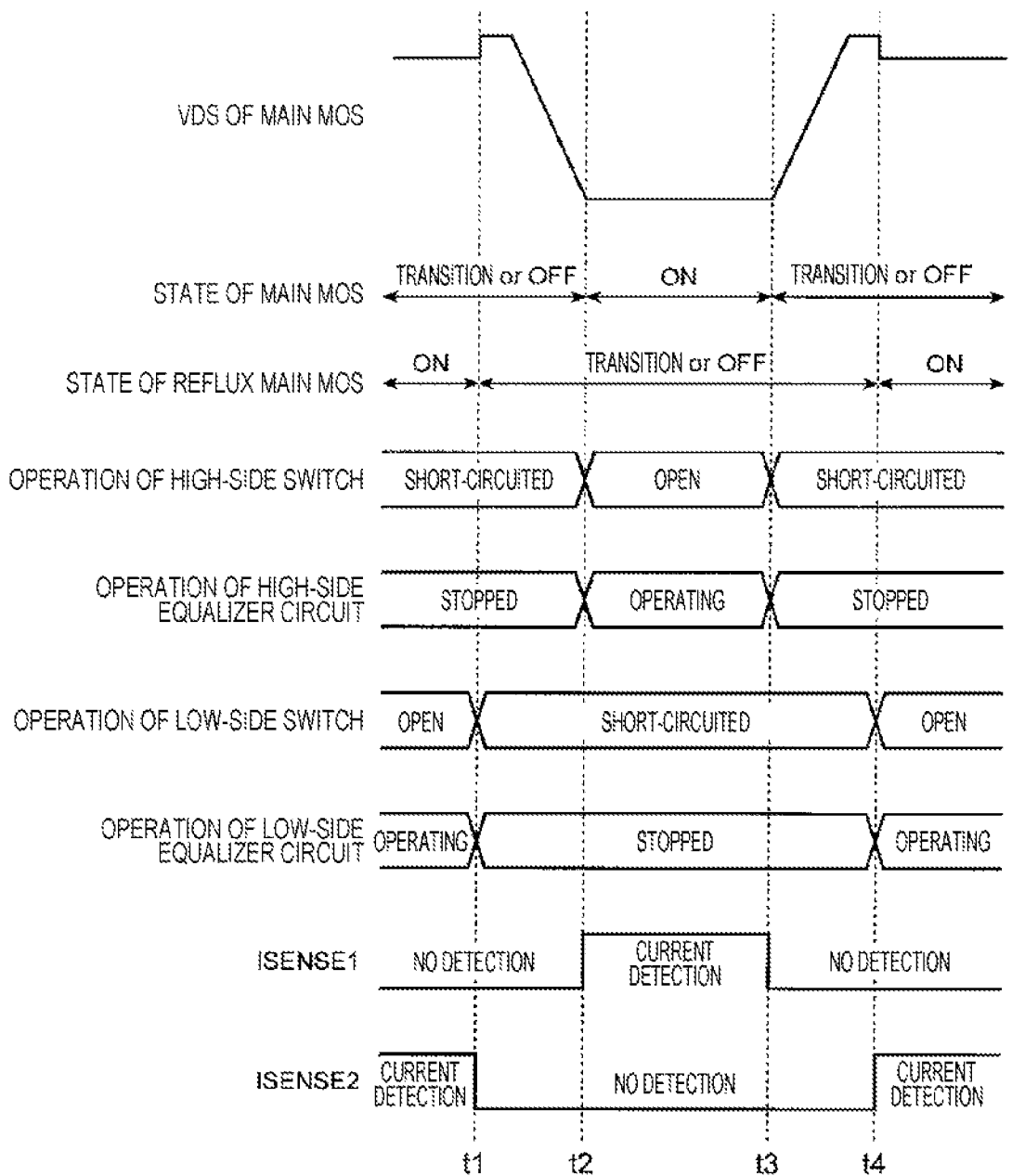
FIG. 4 is a timing chart of the L load drive circuit illustrated in FIG. 3.

FIG. 4 is a timing chart of the L load drive circuit illustrated in FIG. 3. FIG. 4 illustrates the state changes of the drain-source voltage VDS of the main MOS 201, the main MOS 201, the reflux main MOS 203, the switch 220, the equalizer circuit 210, the switch 240, the equalizer circuit 230, the detection current ISENSE1, and the detection current ISENSE2 over time. In the synchronous rectification type L load drive circuit, the L load 280 is driven by a periodic pulse in which the main MOS 201 and the reflux main MOS 203 alternately repeat ON and OFF.

As illustrated in FIG. 4, the section before time t1 is the OFF section of the main MOS 201 and the ON section of the reflux main MOS 203. The nodes N1 and N2 are short-circuited by the switch 220 on the high side, and the equalizer circuit 210 on the high side is stopped. On the other hand, the low-side switch 240 between the nodes GND1 and N4 is opened, and the voltages of the nodes GND1 and N4 are equalized by the low-side equalizer circuit 230. The voltage conditions of all the terminals of the main MOS 201 and the sense MOS 202 are matched by the switch 220, and the voltage conditions of all the terminals of the reflux main MOS 203 and the reflux sense MOS 204 are matched by the equalizer circuit 230. In this section, the high-side detection current ISENSE1 is not output, and the high side is in a current non-detection state.

The section from time t1 to time t2 is a transition section in which the main MOS 201 transitions from the OFF state to the ON state and the reflux main MOS 203 transitions from the ON state to the OFF state. The nodes N1 and N2 are short-circuited by the switch 220 on the high side, and the equalizer circuit 210 on the high side is stopped. Similarly, the nodes GND1 and N4 are short-circuited by the low-side switch 240, and the low-side equalizer circuit 230 is stopped.

The voltage conditions of all the terminals of the main MOS 201 and the sense MOS 202 are matched by the switch 220, and the voltage conditions of all the terminals of the reflux main MOS 203 and the reflux sense MOS 204 are matched by the switch 240. In this section, the high-side detection current ISENSE1 and the low-side detection current ISENSE2 are not output, and both the high side and low side are in the current non-detection state.

The section from time t2 to time t3 is the ON section of the main MOS 201 and the OFF section of the reflux main MOS 203. The high-side switch 220 between the nodes N1 and N2 is opened, and the voltages of the nodes N1 and N2 are equalized by the high-side equalizer circuit 210. On the other hand, the nodes GND1 and N4 are short-circuited by the low-side switch 240, and the low-side equalizer circuit 230 is stopped. The voltage conditions of all the terminals of the main MOS 201 and the sense MOS 202 are matched by the equalizer circuit 210, and the voltage conditions of all the terminals of the reflux main MOS 203 and the reflux sense MOS 204 are matched by the switch 240. In this section, the low-side detection current ISENSE2 is not output, and the low side is in a current non-detection state.

The section from time t3 to time t4 is a transition section in which the main MOS 201 transitions from the ON state to the OFF state and the reflux main MOS 203 transitions from the OFF state to the ON state. The nodes N1 and N2 are short-circuited by the switch 220 on the high side, and the equalizer circuit 210 on the high side is stopped. Similarly, the nodes GND1 and N4 are short-circuited by the low-side switch 240, and the low-side equalizer circuit 230 is stopped.

The voltage conditions of all the terminals of the main MOS 201 and the sense MOS 202 are matched by the switch 220, and the voltage conditions of all the terminals of the reflux main MOS 203 and the reflux sense MOS 204 are matched by the switch 240. In this section, the high-side detection current ISENSE1 and the low-side detection current ISENSE2 are not output, and both the high side and low side are in the current non-detection state. After time t4, the above operation is repeated.

In this way, the high-side switch 220 short-circuits the source terminals of the main MOS 201 and the sense MOS 202 from the start of the transition from the ON state to the OFF state of the main MOS 201 and the sense MOS 202 to the end of the transition from the OFF state to the ON state. Further, the low-side switch 240 short-circuits the source terminals of the reflux main MOS 203 and the reflux sense MOS 204 from the start of the transition from the ON state to the OFF state of the reflux main MOS 203 and the reflux sense MOS 204 to the end of the transition from the OFF state to the ON state.

By the above operation, the voltage conditions match for all the terminals of the main MOS 201 and the sense MOS 202 over the entire sections from the OFF section to the ON section of the main MOS 201.

Further, the voltage conditions are the same for all the terminals of the reflux main MOS 203 and the reflux sense MOS 204 from the OFF section to the ON section of the reflux main MOS 203. Therefore, since the on-resistance ratio of the main MOS 201 and the sense MOS 202 and the on-resistance ratio of the reflux main MOS 203 and the reflux sense MOS 204 are maintained, the accuracy of the detection current value of the L load drive circuit can be maintained without deterioration over time.

Second Embodiment

Figure 5:
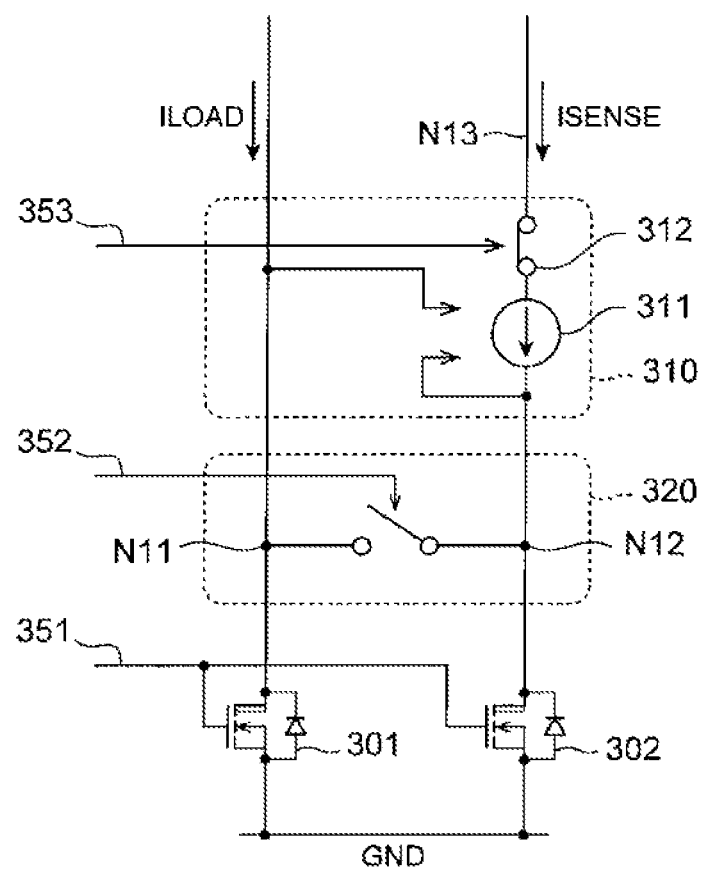
FIG. 5 is a schematic view of a load drive device according to a second embodiment.

FIG. 5 is a schematic view of the load drive device according to the second embodiment. The load drive device according to the second embodiment is different from the first embodiment in that a load 480 (see FIG. 6) is driven by the suction control of the current to the ground GND. Therefore, the description of the configuration similar to that of the first embodiment will be omitted as much as possible.

A control signal 351 is input to the gate terminal of a main MOS 301, and the main MOS 301 is switched ON or OFF by controlling the gate voltage. The drain terminal (one main terminal) of the main MOS 301 is connected to a node N11 on the load current path, and the source terminal (the other main terminal) of the main MOS 301 is earthed to the ground GND.

The gate terminal of a sense MOS 302 has a common connection with the gate terminal of the main MOS 301, the control signal 351 is input, and the sense MOS 302 is switched ON or OFF by controlling the gate voltage. The drain terminal (one main terminal) of the sense MOS 302 is connected to a node N12 on the detection current path, and the source terminal (the other main terminal) of the sense MOS 302 has a common connection with the source terminal of the main MOS 301 to be earthed to the ground GND. Further, the characteristics of the sense MOS 302 match the characteristics of the main MOS 301, and the on-resistance of the sense MOS 302 is set to K times the on-resistance of the main MOS 301.

Further, an equalizer circuit 310 and a switch 320 are provided in parallel between the drain terminal of the main MOS 301 and the drain terminal of the sense MOS 302. A control signal 353 synchronized with the control signal 351 is input to the equalizer circuit 310, and a control signal 352 synchronized with the inverted signal of the control signal 351 is input to the switch 320. The equalizer circuit 310 and the switch 320 are configured in the same manner as the equalizer circuit 110 and the switch 120 of the first embodiment.

Therefore, in the ON section of the main MOS 301, the voltages of the nodes N11 and N12 (the terminal voltage of the main MOS 301 and the terminal voltage of the sense MOS 302) are equalized by the equalizer circuit 310, and the nodes N11 and N12 are short-circuited by the switch 320 in the OFF section and the transition section of the main MOS 301.

Also in the second embodiment, the voltage conditions are the same for all the terminals of the main MOS 301 and the sense MOS 302 over the entire section from the OFF section to the ON section of the main MOS 301. Therefore, it can be expected that the electrical stress conditions of both are equal and the amount of deterioration due to electrical stress is also equal. At this time, since the on-resistance ratio of the main MOS 301 and the sense MOS 302 is maintained, the accuracy of the detection current value can be maintained without deterioration over time. The timing chart of the load drive device is the same as the timing chart of FIG. 2.

Figure 6:
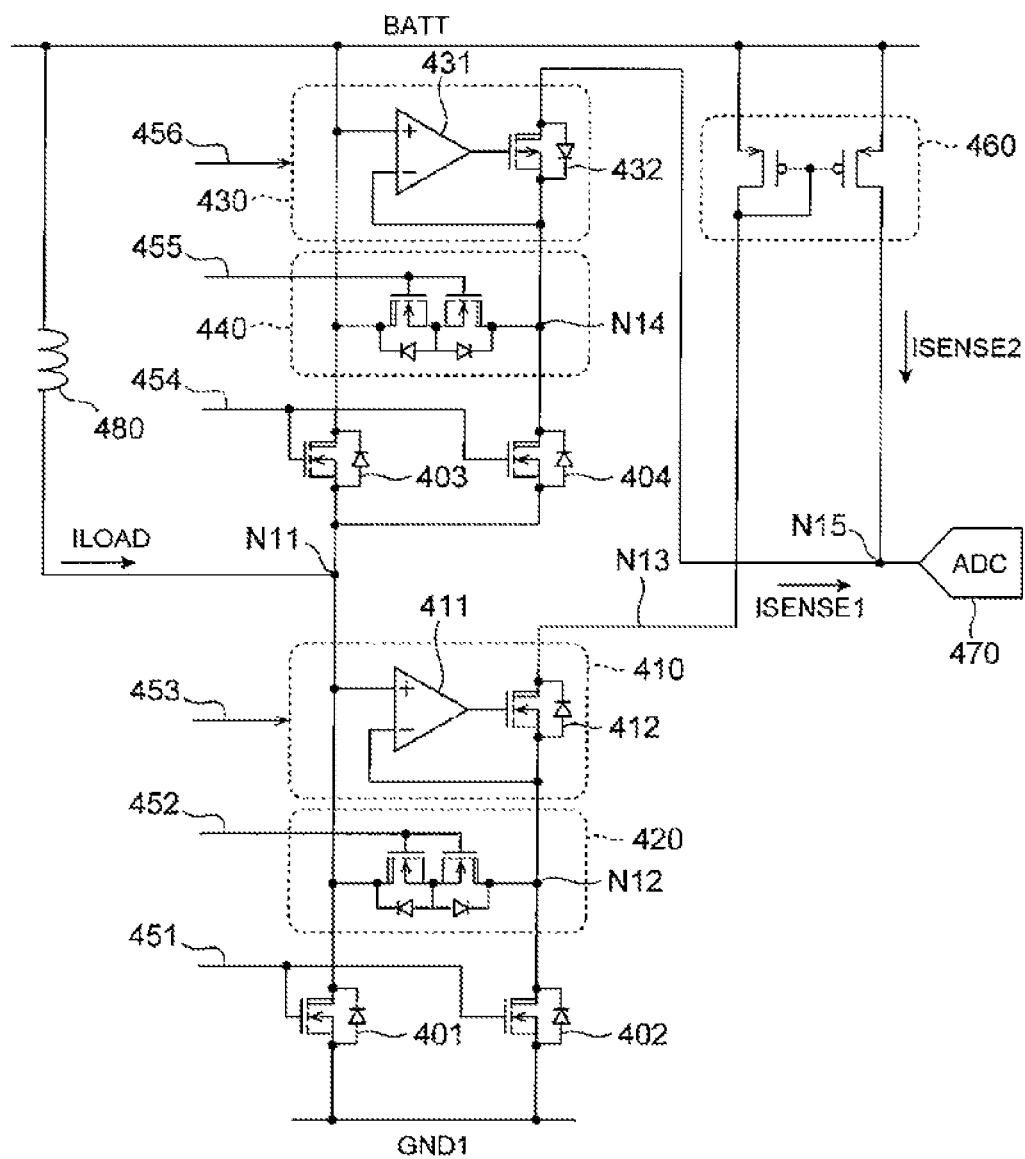
FIG. 6 is a circuit diagram of an L load drive circuit according to a second embodiment.

FIG. 6 is a circuit diagram of the L load drive circuit (load drive device) according to the second embodiment. Here, an example in which the circuit configuration illustrated in FIG. 5 is applied to a low-side driver of a synchronous rectification type L load drive circuit as a load drive device will be described. The L load drive circuit is provided with a current detection circuit that detects the load current ILOAD on the high side and the low side. Further, the L load drive circuit is provided with a PMOS current mirror circuit 460 for detecting current on the high side (reflux side). Further, the L load drive circuit is provided with an ADC 470 that converts the detection current into a digital signal for detection.

On the low side of the L load drive circuit, a main MOS 401 is provided on the load current path, and a sense MOS 402 is provided on the detection current path. The main MOS 401 operates as a low-side switch on the load current path by controlling the gate voltage by the control signal 451. The drain terminal of the main MOS 401 is connected to the L load 480 via the node N11, and the source terminal of the main MOS 401 is earthed to the node GND1. When the main MOS 401 is turned ON, the load current ILOAD is supplied from the voltage source BATT to the L load 480 to drive the L load 480.

The gate terminal of the sense MOS 402 has a common connection with the gate terminal of the main MOS 401, and the gate voltage is controlled by the control signal 451 to operate as a low-side switch on the detection current path. The drain terminal of the sense MOS 402 is connected to the current input side of the current mirror circuit 460 via the node N12, and the source terminal of the sense MOS 402 has a common connection with the source terminal of the main MOS 401 and is earthed to the node GND1. Further, the characteristics of the sense MOS 402 match the characteristics of the main MOS 401, and the on-resistance of the sense MOS 402 is set to K times the on-resistance of the main MOS 401.

An equalizer circuit 410 and a switch 420 are provided in parallel between the drain terminals of the main MOS 401 and the sense MOS 402. A control signal 453 synchronized with the control signal 451 is input to the equalizer circuit 410, the equalizer circuit 410 is controlled to be the operating state when the main MOS 401 is turned ON, and the equalizer circuit 410 is controlled to be the stopped state when the main MOS 401 is turned OFF. The equalizer circuit 410 includes an operational amplifier 411 and an NMOS 412, and the operational amplifier 411 controls the amount of current passing through the NMOS 412 so that the inverting input terminal and the non-inverting input terminal are virtually short-circuited.

A control signal 452 synchronized with the inversion signal of the control signal 451 is input to the switch 420, and the switch 420 is controlled to be the open state when the main MOS 401 is turned ON, and the switch 420 is controlled to be the conductive state when the main MOS 401 is turned OFF. Even if the voltage difference between the nodes N11 and N12 is large, the voltages of the nodes N11 and N12 are aligned by short-circuiting the nodes N11 and N12 by the switch 420. Although the switch 420 of this embodiment is formed by a MOSFET, it may be formed by another switching element such as a bipolar transistor.

On the high side of the L load drive circuit, a reflux main MOS 403 is provided on the load current path, and a reflux sense MOS 404 is provided on the detection current path. The gate voltage of the reflux main MOS 403 is controlled by a control signal 454 to operate as a high-side switch on the load current path. The drain terminal of the reflux main MOS 403 is connected to the voltage source BATT, and the source terminal of the reflux main MOS 403 is connected to the L load 480 via the node N1. The reflux main MOS 403 forms a reflux path for releasing the energy stored in the L load 480.

The gate terminal of the reflux sense MOS 404 has a common connection with the gate terminal of the reflux main MOS 403, and the gate voltage is controlled by the control signal 454 to operate as a high-side switch on the detection current path. The drain terminal of the reflux sense MOS 404 is connected to the ADC 470 via the node N14, and the source terminal of the reflux sense MOS 404 is connected to the L load 480 in a common connection with the drain terminal of the reflux main MOS 403. Further, the characteristics of the reflux sense MOS 404 are consistent with those of the reflux main MOS 403, and the on-resistance of the reflux sense MOS 404 is set to K times the on-resistance of the reflux main MOS 403.

An equalizer circuit 430 and a switch 440 are provided in parallel between the drain terminals of the reflux main MOS 403 and the reflux sense MOS 404. A control signal 456 synchronized with the control signal 454 is input to the equalizer circuit 430, the equalizer circuit 430 is controlled to be the operating state when the reflux main MOS 403 is turned ON, and the equalizer circuit 430 is controlled to be the stopped state when the reflux main MOS 403 is turned OFF. The equalizer circuit 430 includes an operational amplifier 431 and a PMOS 432, and the operational amplifier 431 controls the amount of current passing through the PMOS 432 so that the inverting input terminal and the non-inverting input terminal are virtually short-circuited.

A control signal 455 synchronized with the inversion signal of the control signal 454 is input to the switch 440, and the switch 440 is controlled to be the open state when the reflux main MOS 403 is turned ON, and the switch 440 is controlled to be the conductive state when the reflux main MOS 403 is turned OFF. Even if the voltage difference between the node (voltage source) BATT and the note N14 is large, the voltages of the nodes BATT and N14 are aligned by short-circuiting the nodes N11 and N14 by the switch 440. Although the switch 440 of this embodiment is formed by a MOSFET, it may be formed by another switching element such as a bipolar transistor.

The current mirror circuit 460 is formed by a PMOS on the current input side and a PMOS on the current output side. The current input side of the current mirror circuit 460 is provided between the voltage source BATT and the NMOS 412 of the low-side equalizer circuit 410, and the current output side of the current mirror circuit 460 is provided between the voltage source BATT and the ADC 470. The current mirror circuit 460 copies the current in the low-side detection current path when the reflux sense MOS 402 is turned ON, and outputs the current as the detection current toward the ADC 470 on the current output side.

In the L load drive circuit configured in this way, the low-side main MOS 401 and the high-side reflux main MOS 403 can be switched ON and OFF alternately. When the low-side main MOS 401 is turned ON, the low-side sense MOS 402 is turned ON, and the high-side reflux main MOS 403 and reflux sense MOS 404 are turned OFF. As a result, the load current ILOAD flows from the voltage source BATT to the low-side main MOS 401 via the L load 480. Further, when the current flows from the voltage source BATT to the sense MOS 402 on the current input side of the current mirror circuit 460, the detection current ISENSE2 flows from the voltage source BATT to the ADC 470 on the current output side of the current mirror circuit 460.

When the high-side reflux main MOS 403 is turned ON, the high-side reflux sense MOS 404 is turned ON, and the low-side main MOS 401 and sense MOS 402 are turned OFF. Even if the low-side main MOS 401 is turned OFF, the load current ILOAD is drawn into the L load 480, so the load current ILOAD flows from the voltage source BATT to the high-side reflux main MOS 403 via the L load 480. In addition, the detection current ISENSE1 flows from the high-side reflux sense MOS 404 toward the ADC 470. Although the circuit configuration of FIG. 5 is applied to both the low side and the high side here, the circuit configuration of FIG. 5 may be applied to at least one of them.

The timing chart of the L load drive circuit is the same as the timing chart of FIG. 4. Therefore, the low-side switch 420 short-circuits the drain terminals of the main MOS 401 and the sense MOS 402 from the start of the transition from the ON state to the OFF state of the main MOS 401 and the sense MOS 402 to the end of the transition from the OFF state to the ON state. Further, the high-side switch 440 short-circuits the drain terminals of the reflux main MOS 403 and the reflux sense MOS 404 from the start of the transition from the ON state to the OFF state of the reflux main MOS 403 and the reflux sense MOS 404 to the end of the transition from the OFF state to the ON state.

Also in the second embodiment, the voltage conditions are the same for all the terminals of the main MOS 401 and the sense MOS 402 over the entire section from the OFF section to the ON section of the main MOS 401. Further, the voltage conditions are the same for all the terminals of the reflux main MOS 403 and the reflux sense MOS 404 from the OFF section to the ON section of the reflux main MOS 403. Therefore, since the on-resistance ratio of the main MOS 401 and the sense MOS 402 and the on-resistance ratio of the reflux main MOS 403 and the reflux sense MOS 404 are maintained, the accuracy of the detection current value of the L load drive circuit can be maintained without deterioration over time.

Third Embodiment

Figure 7:
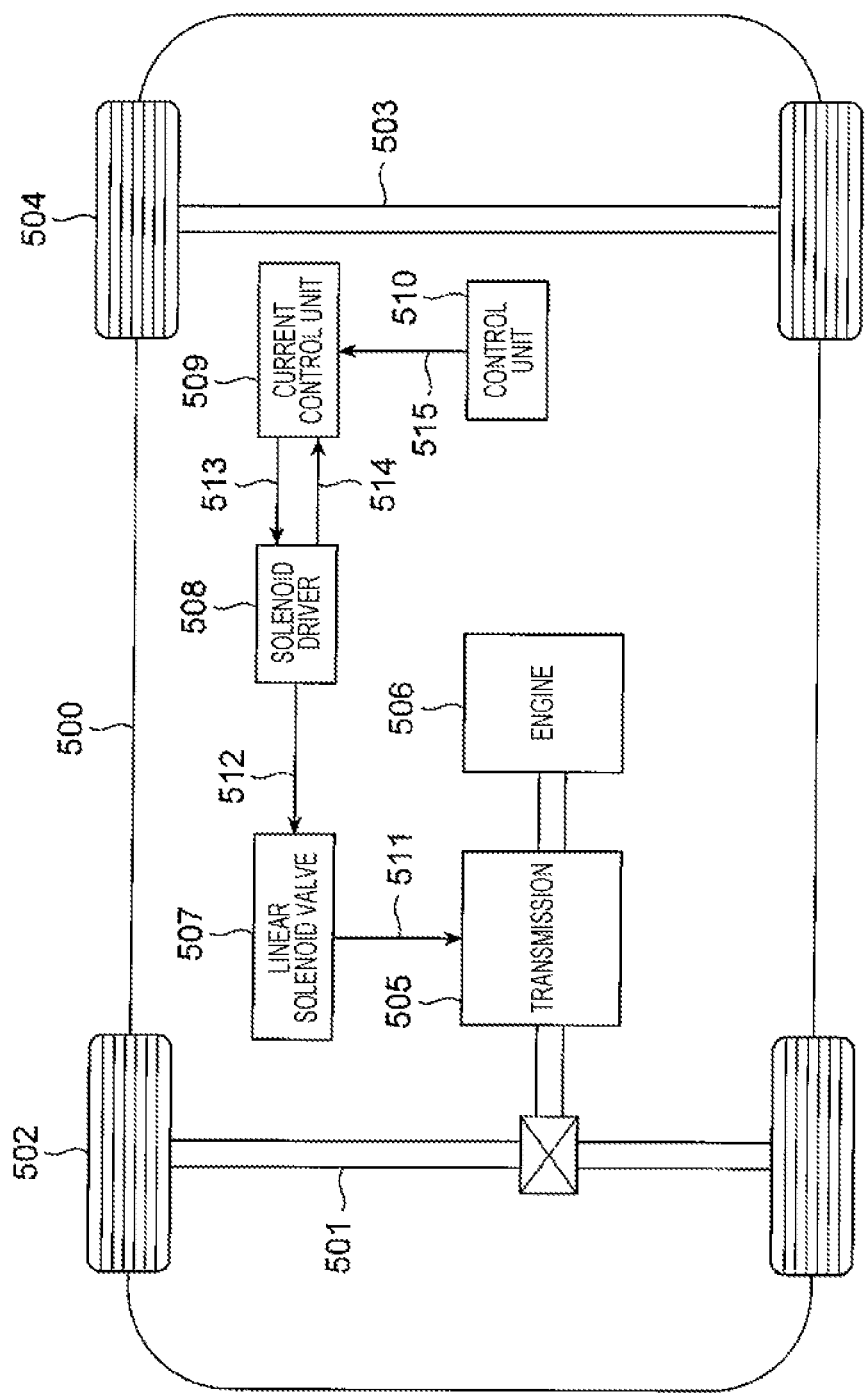
FIG. 7 is a block diagram of a transmission drive system according to a third embodiment.

Next, a transmission drive system according to the third embodiment will be described with reference to FIG. 7. FIG. 7 is a block diagram of the transmission drive system according to the third embodiment. Here, a transmission drive system equipped with the load drive device of the first embodiment or the second embodiment as a solenoid driver will be described. Further, although this embodiment relates to a vehicle using a transmission, the same effect can be obtained by applying the technique of the present disclosure to other devices.

As illustrated in FIG. 7, in the transmission drive system, a pair of axles 501 and 503 are pivotally supported by a vehicle body 500. Wheels 502 are fixed to both ends of one axle 501, and wheels 504 are fixed to both ends of the other axle 503. An engine 506 is connected to one axle 501 via a transmission 505, and the power of the engine 506 is changed by adjusting the gear ratio of the transmission 505 and transmitted to the wheels 502. The transmission 505 is equipped with a linear solenoid valve 507 that drives a gear ratio adjustment mechanism by a hydraulic pressure 511. The linear solenoid valve 507 is a hydraulic control valve, and outputs the hydraulic pressure 511 according to an input current amount to the transmission 505.

A solenoid driver (load drive device) 508 is connected to the load (solenoid) of the linear solenoid valve 507. A load current 512 output from the solenoid driver 508 to the linear solenoid valve 507 is controlled by a current control unit 509. A control signal (periodic pulse) 513 is output from the current control unit 509 to the solenoid driver 508 to control the load current 512, and a detection current value 514 of the load current 512 is fed back from the solenoid driver 508 to the current control unit 509. The current control unit 509 controls the load current 512 of the solenoid driver 508 so that the detection current value 514 approaches a target current value 515 set by a control unit 510.

The control unit 510 determines an optimum gear operation from information such as the vehicle speed and engine speed of the vehicle body 500, and instructs the current control unit 509 of the target current value of the load current of the linear solenoid valve 507 required for the gear operation. The control unit 510 is composed of a processor that executes various processes, an integrated circuit, a memory, and the like. The memory is composed of one or more recording media such as ROM (Read Only Memory) and RAM (Random Access Memory) depending on the intended use.

With the above configuration, it is possible to obtain a transmission drive system in which the load current accuracy of the linear solenoid valve does not easily deteriorate over time. Since the current accuracy corresponds to the control accuracy of the hydraulic control, highly accurate transmission operation is possible for a long period of time.

Hitherto, the embodiments of the invention have been described, but the invention is not limited to the embodiments. Various modifications may be made within a scope not departing from the spirit of the invention disclosed in claims. For example, the above-described embodiments of the invention have been described in detail in a clearly understandable way, and are not necessarily limited to those having all the described configurations. In addition, some of the configurations of a certain embodiment may be replaced with the configurations of the other embodiments, and the configurations of the other embodiments may be added to the configurations of the subject embodiment. In addition, some of the configurations of each embodiment may be omitted, replaced with other configurations, and added to other configurations.

REFERENCE SIGNS LIST

101,201,301,401 main MOS (main MOSFET)
102,202,302,402 sense MOS (sense MOSFET)
203,403 reflux main MOS (main MOSFET)
204,404 reflux sense MOS (sense MOSFET)
110,210,230,310,410,430 equalizer circuit
120,220,240,320,420,440 switch
280,480 load (inductive load)
505 transmission
508 solenoid driver (load drive device)
BATT voltage source
ILOAD load current
ISENSE1 detection current
ISENSE2 detection current

The invention claimed is:

1. A load drive device for driving a load according to a load current and detecting the load current, comprising:
   a main MOSFET that outputs the load current;
   a sense MOSFET that is used to detect the load current;
   an equalizer circuit that is provided between one main terminal of the main MOSFET and one main terminal of the sense MOSFET; and
   a switch that is provided in parallel with the equalizer circuit between the one main terminal of the main MOSFET and the one main terminal of the sense MOSFET, wherein another main terminal of the main MOSFET and another main terminal of the sense MOSFET have a common connection, wherein the equalizer circuit equalizes a terminal voltage of the main MOSFET and a terminal voltage of the sense MOSFET when a current is detected, and the switch is opened, wherein the equalizer circuit is stopped when a current is not detected, and the one main terminal of the main MOSFET and the one main terminal of the sense MOSFET are short-circuited by the switch, wherein, when a current is detected in an ON state of the main MOSFET, the terminal voltage of the main MOSFET and the terminal voltage of the sense MOSFET are equalized by the equalizer circuit, and the switch is opened, and wherein, when a current is not detected in an OFF state of the main MOSFET, the equalizer circuit is stopped and the one main terminal of the main MOSFET and the one main terminal of the sense MOSFET are short-circuited by the switch.

2. The load drive device according to claim 1, wherein the one main terminal of the main MOSFET and the one main terminal of the sense MOSFET are source terminals, and the other main terminal of the main MOSFET and the other main terminal of the sense MOSFET are drain terminals.

3. The load drive device according to claim 1, wherein the one main terminal of the main MOSFET and the one main terminal of the sense MOSFET are drain terminals, and the other main terminal of the main MOSFET and the other main terminal of the sense MOSFET are source terminals.

4. The load drive device according to claim 1, wherein the load is an inductive load.

5. A transmission drive system, comprising:
the load drive device according to claim 1; and
a transmission connected to the load drive device,
wherein the transmission is speed-controlled according to a load current output from a solenoid driver to a linear solenoid valve, where the linear solenoid valve drives the transmission.

6. A load drive device for driving a load according to a load current and detecting the load current, comprising:
a main MOSFET that outputs the load current;
a sense MOSFET that is used to detect the load current;
an equalizer circuit that is provided between one main terminal of the main MOSFET and one main terminal of the sense MOSFET; and
a switch that is provided in parallel with the equalizer circuit between the one main terminal of the main MOSFET and the one main terminal of the sense MOSFET, wherein another main terminal of the main MOSFET and another main terminal of the sense MOSFET have a common connection, wherein the equalizer circuit equalizes a terminal voltage of the main MOSFET and a terminal voltage of the sense MOSFET when a current is detected, and the switch is opened, wherein the equalizer circuit is stopped when a current is not detected, and the one main terminal of the main MOSFET and the one main terminal of the sense MOSFET are short-circuited by the switch, wherein the one main terminal of the main MOSFET and the one main terminal of the sense MOSFET are source terminals, and the other main terminal of the main MOSFET and the other main terminal of the sense MOSFET are drain terminals, wherein the main MOSFET is a pair of high-side and low-side main MOSFETs, and the sense MOSFET is a pair of high-side and low-side sense MOSFETs, wherein the drain terminal of the high-side main MOSFET and the drain terminal of the sense MOSFET are connected to a voltage source, and wherein the source terminal of the main MOSFET and the source terminal of the sense MOSFET are short-circuited by the switch from a start of transitioning from an ON state to an OFF state of the main MOSFET and the sense MOSFET on the high side to an end of transitioning from the OFF state to the ON state.

7. The load drive device according to claim 6, wherein the drain terminal of the main MOSFET and the drain terminal of the sense MOSFET on the low side are connected to the load, and wherein the source terminal of the main MOSFET and the source terminal of the sense MOSFET are short-circuited by the switch from a start of transitioning from the ON state to the OFF state of the main MOSFET and the sense MOSFET on the low side to an end of transitioning from the OFF state to the ON state.

8. A load drive device for driving a load according to a load current and detecting the load current, comprising:
a main MOSFET that outputs the load current;
a sense MOSFET that is used to detect the load current;
an equalizer circuit that is provided between one main terminal of the main MOSFET and one main terminal of the sense MOSFET; and
a switch that is provided in parallel with the equalizer circuit between the one main terminal of the main MOSFET and the one main terminal of the sense MOSFET, wherein another main terminal of the main MOSFET and another main terminal of the sense MOSFET have a common connection, wherein the equalizer circuit equalizes a terminal voltage of the main MOSFET and a terminal voltage of the sense MOSFET when a current is detected, and the switch is opened, wherein the equalizer circuit is stopped when a current is not detected, and the one main terminal of the main MOSFET and the one main terminal of the sense MOSFET are short-circuited by the switch, wherein the one main terminal of the main MOSFET and the one main terminal of the sense MOSFET are drain terminals, and the other main terminal of the main MOSFET and the other main terminal of the sense MOSFET are source terminals, wherein the main MOSFET is a pair of high-side and low-side main MOSFETs, and the sense MOSFET is a pair of high-side and low-side sense MOSFETs, wherein the source terminal of the main MOSFET and the source terminal of the sense MOSFET on the low side are earthed a ground, and wherein the drain terminal of the main MOSFET and the drain terminal of the sense MOSFET are short-circuited by the switch from a start of transitioning from an ON state to an OFF state of the main MOSFET and the sense MOSFET on the low side to an end of transitioning from the OFF state to the ON state.

9. The load drive device according to claim 8, wherein the source terminal of the main MOSFET and the source terminal of the sense MOSFET on the high side are connected to the load, and wherein the drain terminal of the main MOSFET and the drain terminal of the sense MOSFET are short-circuited by the switch from a start of transitioning from the ON state to the OFF state of the main MOSFET and the sense MOSFET on the high side to an end of transitioning from the OFF state to the ON state.

\* \* \* \* \*